United States Patent
Lim et al.

(10) Patent No.: US 8,803,265 B2
(45) Date of Patent: Aug. 12, 2014

(54) MAGNETIC MEMORY LAYER AND MAGNETIC MEMORY DEVICE INCLUDING THE SAME

(75) Inventors: Woo-chang Lim, Hwaseong-si (KR); Young-hyun Kim, Seoul (KR); Jun-ho Jeong, Suwon-si (KR); Hee-ju Shin, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 50 days.

(21) Appl. No.: 13/170,870

(22) Filed: Jun. 28, 2011

(65) Prior Publication Data

US 2012/0018824 A1    Jan. 26, 2012

(30) Foreign Application Priority Data

Jul. 22, 2010    (KR) ........................ 10-2010-0071061

(51) Int. Cl.
*H01L 29/82*    (2006.01)
(52) U.S. Cl.
USPC ............................ 257/421; 257/422; 257/427
(58) Field of Classification Search
USPC .................................................. 257/421, 451
See application file for complete search history.

(56) References Cited

U.S. PATENT DOCUMENTS

| 7,354,665 | B2 * | 4/2008 | Ajan et al. ................. 428/832.1 |
| 7,663,848 | B1 * | 2/2010 | Huai et al. ................. 360/324.2 |
| 7,782,660 | B2 * | 8/2010 | Assefa et al. ................. 365/158 |
| 2008/0310214 | A1 * | 12/2008 | Wang et al. ................... 365/158 |
| 2010/0118603 | A1 * | 5/2010 | Wang et al. ................... 365/171 |
| 2010/0226048 | A1 * | 9/2010 | Fukuzawa et al. ........ 360/324.12 |
| 2011/0064969 | A1 * | 3/2011 | Chen et al. .................... 428/800 |
| 2011/0089507 | A1 * | 4/2011 | Mao .............................. 257/421 |
| 2011/0170341 | A1 * | 7/2011 | Butler ........................... 365/171 |

FOREIGN PATENT DOCUMENTS

| JP | 2005-251373 A | 9/2005 |
| JP | 2006-260633 A | 9/2006 |

* cited by examiner

*Primary Examiner* — Julio J Maldonado
*Assistant Examiner* — Jaehwan Oh
(74) *Attorney, Agent, or Firm* — Lee & Morse, P.C.

(57) ABSTRACT

A magnetic memory layer and a magnetic memory device including the same, the magnetic memory layer including a first seed layer; a second seed layer on the first seed layer, the second seed layer grown according to a <002> crystal direction with respect to a surface of the first seed layer; and a main magnetic layer on the second seed layer, the main magnetic layer grown according to the <002> crystal direction with respect to a surface of the second seed layer.

20 Claims, 11 Drawing Sheets

MAGNETIC MEMORY LAYER AND MAGNETIC MEMORY DEVICE INCLUDING THE SAME

CROSS-REFERENCE TO RELATED APPLICATIONS

This application claims priority under 35 U.S.C. §119 to Korean Patent Application No. 10-2010-0071061, filed on Jul. 22, 2010, in the Korean Intellectual Property Office, and entitled: "Magnetic Memory Device and Memory Card and System Including the Same," which is incorporated by reference herein in its entirety.

BACKGROUND

1. Field

Embodiments relate to a magnetic memory layer and magnetic memory device including the same.

2. Description of the Related Art

In semiconductor products, high-capacity data processing performance with a decreased size thereof is desirable. An increase in an operation speed and a degree of integrity or integration of a memory device used for the semiconductor products is also desirable. Accordingly, a magnetic memory device, e.g., a magnetic RAM (MRAM), has been developed, in which a memory function is embodied by using a change in resistance according to a change in polarity of a magnetic body. Recently, a magnetic memory device using vertical magnetization has been considered.

SUMMARY

Embodiments are directed to a magnetic memory layer and a magnetic memory device including the same.

The embodiments may be realized by providing a magnetic memory layer including a first seed layer; a second seed layer on the first seed layer, the second seed layer grown according to a <002> crystal direction with respect to a surface of the first seed layer; and a main magnetic layer on the second seed layer, the main magnetic layer grown according to the <002> crystal direction with respect to a surface of the second seed layer.

The <002> crystal direction of the main magnetic layer may be an easy magnetization direction.

The first seed layer may include at least one of titanium, tantalum, platinum, and iron.

The first seed layer may have a thickness of about 1 Å to about 15 Å.

The first seed layer may be a monoatomic layer.

The second seed layer may have a body centered cubic crystal structure.

The main magnetic layer may have an L10 crystal structure.

The magnetic memory layer may further include a third seed layer between the second seed layer and the main magnetic layer, the third seed layer grown according to the <002> crystal direction with respect to the surface of the second seed layer and having a different crystal structure from that of the second seed layer.

The third seed layer may have a face centered cubic crystal structure.

The third seed layer may include palladium, platinum, or both palladium and platinum.

The magnetic memory layer may further include a base layer under the first seed layer, the base layer including an amorphous material having no crystal direction.

The main magnetic layer may include at least one of iron, cobalt, nickel, palladium, and platinum.

The main magnetic layer may include at least one of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy.

The main magnetic layer may include at least one of boron, carbon, copper, silver, gold, and chromium.

The main magnetic layer may include at least one of boron oxide ($B_2O_3$), silicon oxide ($SiO_2$), magnesium oxide (MgO), or aluminum oxide ($Al_2O_3$).

The second seed layer may include chromium (Cr) or a chromium alloy.

The second seed layer may further include molybdenum or ruthenium.

The embodiments may also be realized by providing a magnetic memory device including a conductive layer having a crystal structure; a crystalline stop layer on the conductive layer, the crystalline stop layer blocking continuity of the crystal structure; an amorphous layer on the crystalline stop layer; a NaCl structure layer on the amorphous layer; a first seed layer on the NaCl structure layer; a second seed layer on the first seed layer, the second seed layer grown according to a <002> crystal direction with respect to a surface of the first seed layer; and a main magnetic layer disposed on the second seed layer, the main magnetic layer grown according to the <002> crystal direction with respect to a surface of the second seed layer.

The embodiments may also be realized by providing a magnetic memory device including a lower electrode; a magnetic memory layer on and electrically connected with the lower electrode, the magnetic memory layer including a sequentially stacked lower magnetic layer, an upper magnetic layer, and a tunnel barrier layer; and an upper electrode on and electrically connected with the magnetic memory layer, wherein the lower magnetic layer includes a first lower seed layer; a second lower seed layer on the first lower seed layer, the second lower seed layer grown according to a <002> crystal direction with respect to a surface of the first lower seed layer; and a lower main magnetic layer on the second lower seed layer, the lower main magnetic layer grown according to the <002> crystal direction with respect to a surface of the second lower seed layer.

The upper magnetic layer may include a first upper seed layer; a second upper seed layer on the first upper seed layer, the second upper seed layer grown according to the <002> crystal direction with respect to a surface of the first upper seed layer; and an upper main magnetic layer on the second upper seed layer, the upper main magnetic layer grown according to the <002> crystal direction with respect to a surface of the second upper seed layer.

BRIEF DESCRIPTION OF THE DRAWINGS

The embodiments will become more apparent to those of ordinary skill in the art by describing in detail exemplary embodiments with reference to the attached drawings, in which.

DETAILED DESCRIPTION

Figure 1:
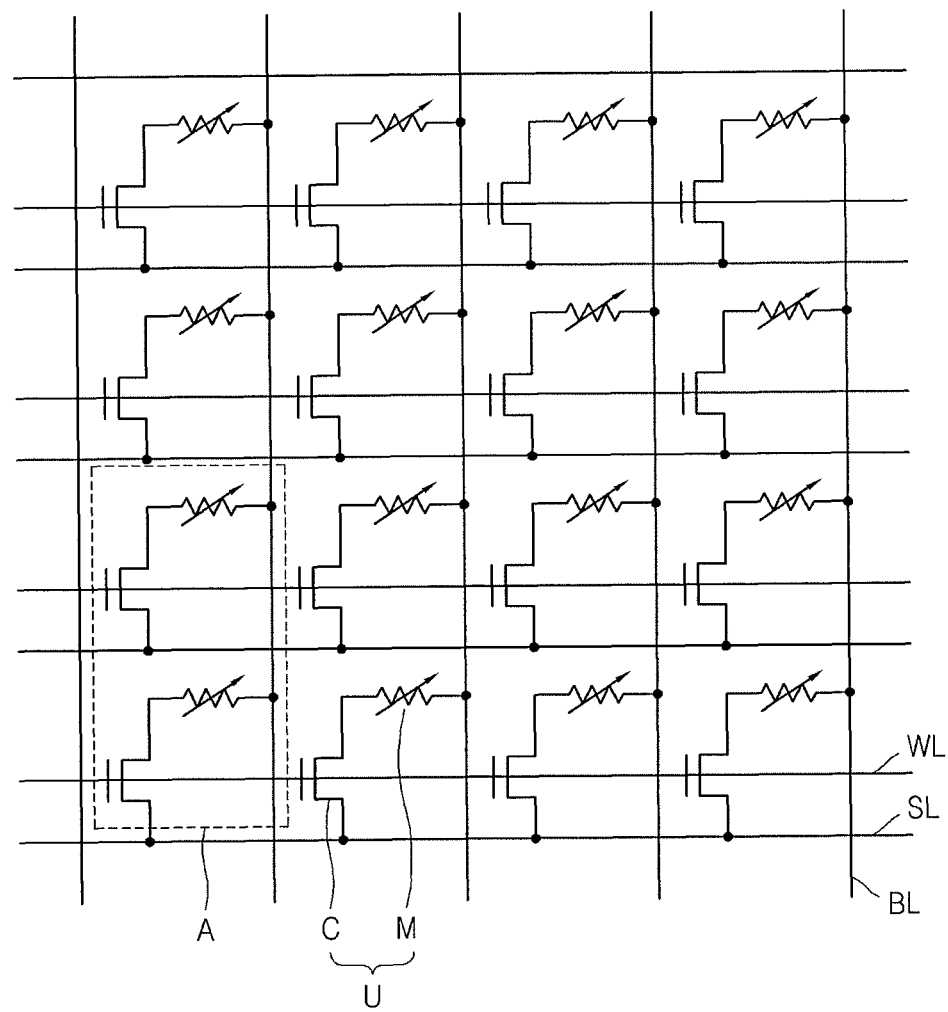
FIG. 1 schematically illustrates a magnetic memory array according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 schematically illustrates a magnetic memory array according to an embodiment.

Referring to FIG. 1, a magnetic memory array may include a plurality of magnetic memory devices arranged in a matrix format. A unit cell U of the magnetic memory devices may include an access unit C and a memory unit M and may be electrically connected with a word line WL and a bit line BL. Also, as illustrated in FIG. 1, when the access unit C is a transistor, the magnetic memory array may further include a source line SL that is electrically connected with a source region of the access unit C. The word line WL and the bit line BL may be arranged in two dimensions, e.g., at a perpendicular angle. Also, the word line WL and the bit line BL may be arranged at a predetermined angle, or to be parallel to each other.

The access unit C may control supply of current to the memory unit M according to a voltage of the word line WL. The access unit C may be, e.g., a MOS transistor, a bipolar transistor, or a diode.

The memory unit M may include a magnetic material and a magnetic tunnel junction (MTJ). Also, the memory unit M may perform a memory function by using a spin transfer torque (STT) phenomenon in which a magnetization direction of a magnetic body varies according to an input current.

Figure 2:
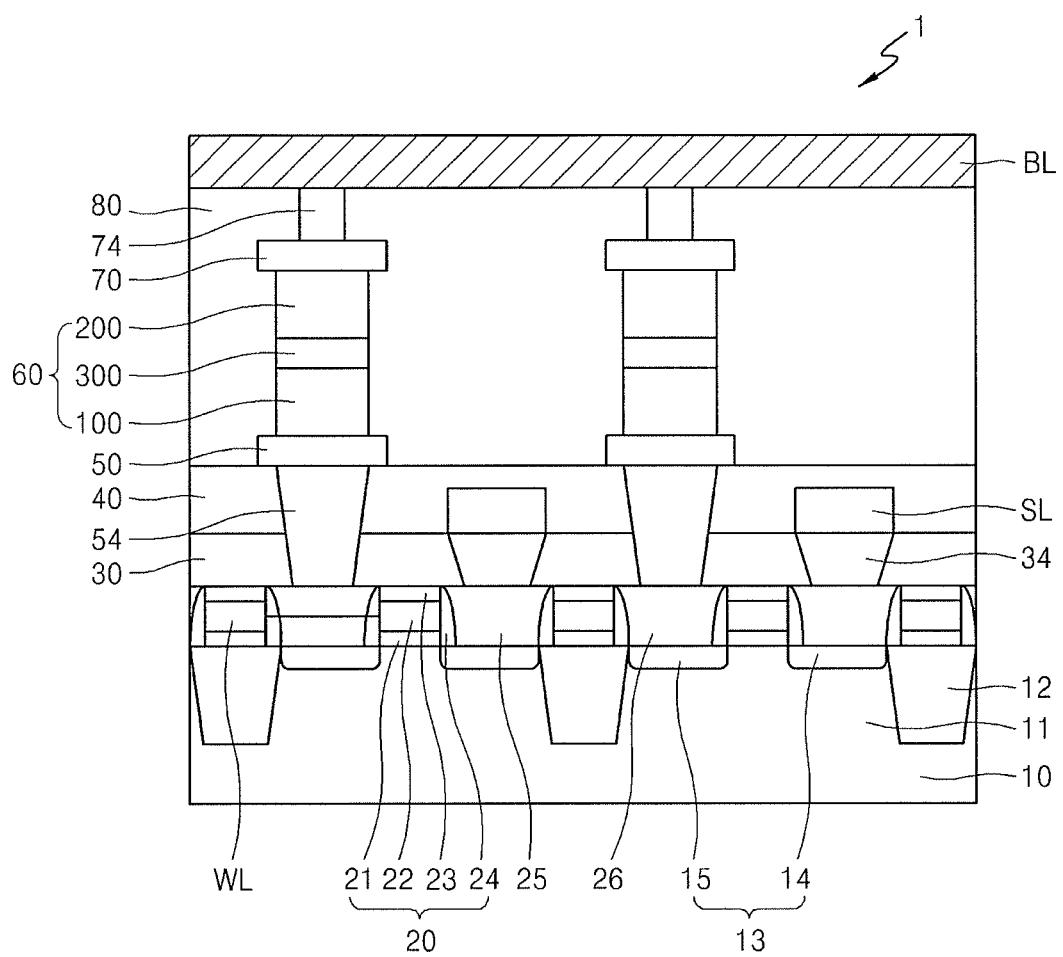
FIG. 2 illustrates a cross-sectional view of a magnetic memory device in a region A of FIG. 1.

FIG. 2 illustrates a cross-sectional view of a magnetic memory device in a region "A" of FIG. 1.

Referring to FIG. 2, the magnetic memory device 1 may include a substrate 10, a gate structure 20 on the substrate 10, and a magnetic memory layer 60 electrically connected with the gate structure 20 and performing a memory function by using magneto-resistance. The gate structure 20 may correspond to the access unit C and the magnetic memory layer 60 may correspond to the memory unit M of the magnetic memory array of FIG. 1.

The substrate 10 may include, e.g., a semiconductor layer formed of silicon (Si), silicon-germanium (SiGe), and/or silicon carbide (SiC), a conductive layer including titanium (Ti), titanium nitride (TiN), aluminum (Al), tantalum (Ta), tantalum nitride (TaN), and/or titanium aluminum nitride (TiAlN), or a dielectric layer including silicon oxide, titanium oxide, aluminum oxide, zirconium oxide, or hafnium oxide. In an implementation, the substrate 10 may include, e.g., an epitaxial layer, a silicon-on-insulator (SOI) layer, and/or a semiconductor-on-insulator (SEOI) layer. Also, although it is not illustrated, in another implementation, the substrate 10 may further include a conductive line, e.g., a word line or bit line, or other semiconductor devices.

The substrate 10 may include an isolation layer 12 defining an active region 11. The isolation layer 12 may be formed by a typical shallow trench isolation (STI) method. The active region 11 may include an impurity region 13. Although it is not illustrated, in an implementation, the impurity region 13 may further include a low-density impurity region (that is close to the gate structure 20) and a high-density impurity region (that is separated from the gate structure 20). The impurity region 13 may include a source region 14 and a drain region 15.

The gate structure 20 may be above, e.g., may overlie, the active region 11 of the substrate 10. The gate structure 20 may include, e.g., a gate insulation layer 21, a gate electrode layer 22, a capping layer 23, and a spacer 24. The gate electrode layer 22 may be the word line WL of FIG. 1. The gate structure 20, the source region 14, and the drain region 15 may constitute a MOS transistor and may function as an access device. Also, the gate structure 20 is not limited to the MOS transistor, and may be, e.g., a bipolar transistor or a diode.

A first contact plug 25 and a second contact plug 26 (which are conductive) may be disposed outside the gate structure 20. The first contact plug 25 may be electrically connected with the source region 14; and the second contact plug 26 may be electrically connected with the drain region 15. The first contact plug 25 and the second contact plug 26 may include a conductive material, e.g., titanium (Ti), titanium nitride (TiN), tungsten (W), and/or tungsten nitride (WN). In an implementation, the first contact plug 25 and the second contact plug 26 may include a stack structure of the above-described materials. Although FIG. 2 illustrates the first contact plug 25 and the second contact plug 26 as having shapes formed in a self-align method using the spacer 24 of the gate structure 20, the first contact plug 25 and the second contact plug 26 are not limited thereto. For example, the first contact plug 25 and the second contact plug 26 may be formed by partially removing a region between the gate structures 20 and filling a removed region with a conductive body.

A first interlayer insulation layer 30 and a second interlayer insulation layer 40 covering the gate structure 20 may be sequentially disposed on the substrate 10. The first interlayer insulation layer 30 and the second interlayer insulation layer 40 may include an oxide, a nitride, and/or an oxynitride, e.g., silicon oxide, silicon nitride, and/or silicon oxynitride. The first interlayer insulation layer 30 and the second interlayer insulation layer 40 may be formed of the same material or different materials.

A third contact plug 34 may be disposed in the first interlayer insulation layer 30. The third contact plug 34 may be electrically connected with the first contact plug 25 by penetrating the first interlayer insulation layer 30. Also, a source line SL (that is electrically connected with the third contact plug 34) may be on the first interlayer insulation layer 30. Accordingly, the source region 14 and the source line SL may be electrically connected with each other via the first contact plug 25 and the third contact plug 34. The third contact plug 34 may include a conductive material, e.g., titanium (Ti), titanium nitride (TiN), tungsten (W), and/or tungsten nitride (WN). In an implementation, the third contact plug 34 may include a stack structure of the above-described materials.

A fourth contact plug 54 may be disposed in the first interlayer insulation layer 30 and the second interlayer insulation layer 40. The fourth contact plug 54 may be electrically connected with the second contact plug 26 by penetrating the first interlayer insulation layer 30 and the second interlayer insulation layer 40. Also, a lower electrode 50 (that is electrically connected with the fourth contact plug 54) may be disposed in or on the second interlayer insulation layer 40. Accordingly, the drain region 15 may be electrically connected with the lower electrode 50 through the second contact plug 26 and the fourth contact plug 54. The fourth contact plug 54 may include a conductive material, e.g., titanium (Ti), titanium nitride (TiN), tungsten (W), and/or tungsten nitride (WN). Also, the fourth contact plug 54 may include a stack structure of the above-described materials.

Although FIG. 2 illustrates the first interlayer insulation layer 30 and the second interlayer insulation layer 40 as being separate layers, the illustration is exemplary and the embodiments are not limited thereto. For example, the first interlayer insulation layer 30 and the second interlayer insulation layer 40 may be a single layer and, in such a case, the source line SL and the lower electrode 50 may not have a step therebetween. For example, the source line SL and the lower electrode 50 may be disposed in the same interlayer insulation layer.

The lower electrode 50 may be formed by a suitable etching method, a damascene method, or a dual damascene method. The lower electrode 50 may include metal, e.g., aluminum (Al), copper (Cu), tungsten (W), titanium (Ti), or tantalum (Ta), an alloy, e.g., titanium tungsten (TiW) or titanium aluminum (TiAl), or carbon (C). In an implementation, the lower electrode 50 may include, e.g., titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON), tantalum oxynitride (TaON), titanium carbon nitride (TiCN), or tantalum carbon nitride (TaCN). Also, the lower electrode 50 may include a stack structure of the above-described materials.

The magnetic memory layer 60 may be on the lower electrode 50 and may be electrically connected therewith. The magnetic memory layer 60 may include, e.g., a lower magnetic layer 100, an upper magnetic layer 200, and a tunnel barrier layer 300 interposed therebetween. The lower magnetic layer 100, the upper magnetic layer 200, and the tunnel barrier layer 300 may constitute a magnetic tunnel junction (MTJ).

The lower magnetic layer 100 and the upper magnetic layer 200 each may have a vertical magnetization direction. For example, the vertical magnetization direction may be perpendicular to a surface of the substrate 10. A memory method, e.g., set, reset, or read, of the magnetic memory layer 60 using the vertical magnetization method will be described below with reference to FIGS. 3 through 6. The lower magnetic layer 100 and the upper magnetic layer 200 each may include one or more seed layers, which will be described below with reference to FIGS. 8 through 13.

The tunnel barrier layer 300 may change the magnetization direction of the lower magnetic layer 100 or the upper magnetic layer 200 as electrons are tunneled. Thus, the tunnel barrier layer 300 may have a thickness suitable for tunneling of electrons. The tunnel barrier layer 300 may include an oxide, a nitride, and/or an oxynitride, e.g., silicon oxide, silicon nitride, silicon oxynitride, aluminum oxide, aluminum nitride, aluminum oxynitride, and/or magnesium oxide.

An upper electrode 70 may be on the magnetic memory layer 60. The magnetic memory layer 60 may be electrically connected with the upper electrode 70. The upper electrode 70 may include a metal, e.g., aluminum (Al), copper (Cu), tungsten (W), titanium (Ti), or tantalum (Ta), an alloy, e.g., titanium tungsten (TiW) or titanium aluminum (TiAl), or carbon (C). In an implementation, the upper electrode 70 may include, e.g., titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON), tantalum oxynitride (TaON), titanium carbon nitride (TiCN), or tantalum carbon nitride (TaCN). Also, the upper electrode 70 may include a stack structure of the above-described materials. The lower electrode 50 and the upper electrode 70 may be formed of the same material or different materials.

A fifth contact plug 74 may be on the upper electrode 70 and may be electrically connected therewith. The fifth contact plug 74 may include, e.g., titanium (Ti), titanium nitride (TiN), tungsten (W), and/or tungsten nitride (WN), or a stack structure thereof.

The lower electrode 50, the magnetic memory layer 60, the upper electrode 70, and the fifth contact plug 74 may be encompassed or surrounded by a third interlayer insulation layer 80. The third interlayer insulation layer 80 may include an oxide, a nitride, or an oxynitride, e.g., silicon nitride, silicon nitride, and/or silicon oxynitride.

The bit line BL may be on the fifth contact plug 74 and may be electrically connected therewith.

In an implementation, the first through fifth contact plugs 25, 26, 34, 54, and 74, the first through third interlayer insulation layers 30, 40, and 80, the lower electrode 50, the upper electrode 70, and the magnetic memory layer 60 may be formed by, e.g., sputtering, chemical vapor deposition (CVD), plasma enhanced CVD (PECVD), or atomic layer deposition (ALD). The structures may be formed by performing a flatness process using a suitable photolithography method, an etching method, a chemical mechanical polishing (CMP), or dry etching.

FIGS. 3 through 6 illustrate sectional views of a method of storing data using a magnetization direction of a magnetic memory layer of the magnetic memory device of FIG. 2.

Referring to FIG. 2, when a predetermined voltage is applied to the word line WL, the gate structure 20 may be turned on; and the source line SL and the bit line BL may be electrically connected with each other through the magnetic memory layer 60. When a direction of current flowing in the magnetic memory layer 60 is changed, at least one of the lower magnetic layer 100 and the upper magnetic layer 200 (included in the magnetic memory layer 60) may vary so that the magnetic memory layer 60 may store data corresponding to "0" or "1". For example, data may be stored as the magnetization direction of the lower magnetic layer 100 and the magnetization direction of the upper magnetic layer 200 are parallel to each other or anti-parallel (e.g., opposite) to each other.

Figure 3:
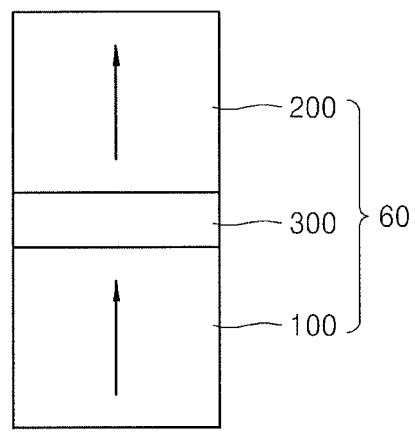
FIGS. 3 through 6 illustrate sectional views of a method of storing data using a magnetization direction of a magnetic memory layer of the magnetic memory device of FIG. 2.
Figure 4:
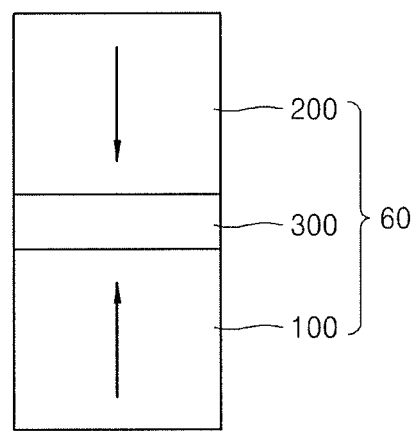

In FIGS. 3 and 4, a case in which the lower magnetic layer 100 is a pinned layer (e.g., in which the magnetization direction is fixed) and the upper magnetic layer 200 is a free layer (e.g., in which the magnetization direction is variable) will be described. For example, the magnetization direction of the lower magnetic layer 100 may be fixed to direct upwardly.

Referring to FIGS. 2 and 3, when current flows from the source line SL to the bit line BL, the magnetization direction may tend to direct upward, e.g., along an easy magnetization axis. Accordingly, the lower magnetic layer 100 and the upper magnetic layer 200 may have the upward magnetization direction and may exhibit a low resistance state. In the low resistance state, data corresponding to "0" may be stored.

Referring to FIGS. 2 and 4, when current flows from the bit line BL to the source line SL, the magnetization direction may tend to direct downward, e.g., opposite to the easy magnetization axis. While the magnetization direction of the upper magnetic layer 200 (e.g., a free layer) is variable and may direct downwardly, the magnetization direction of the lower magnetic layer 100 (e.g., a pinned layer) may not be changed and directs upwardly. Accordingly, the lower magnetic layer 100 and the upper magnetic layer 200 may have anti-parallel magnetization directions and thus may exhibit a high resistance state. In the high resistance state, data corresponding to "1" may be stored.

In contrast, when the magnetization direction of the lower magnetic layer 100 is fixed downwardly, data may be stored contrary to the above descriptions. For example, when current flows from the source line SL to the bit line BL, data corresponding to "1" may be stored; and when current flows from the bit line BL to the source line SL, data corresponding to "0" may be stored.

Figure 5:
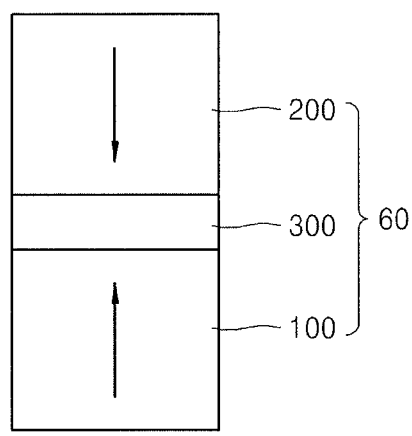
Figure 6:
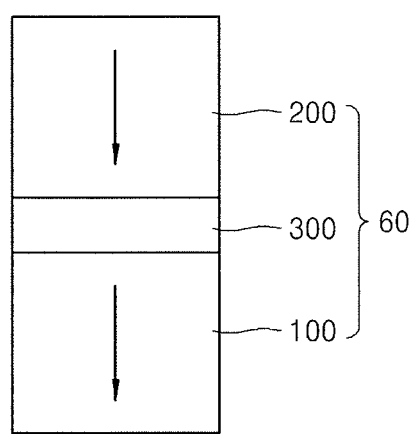

In FIGS. 5 and 6, a case in which the lower magnetic layer 100 is a free layer (e.g., in which the magnetization direction is variable) and the upper magnetic layer 200 is a pinned layer (e.g., in which the magnetization direction is fixed) will be described. For example, the magnetization direction of the upper magnetic layer 200 may be fixed to direct downwardly.

Referring to FIGS. 2 and 5, when current flows from the source line SL to the bit line BL, the magnetization direction may tend to direct upward along the easy magnetization axis. While the magnetization direction of the lower magnetic layer 100 (e.g., a free layer) may direct upwardly, the magnetization direction of the upper magnetic layer 200 (e.g., a pinned layer) may not be changed and thus may direct downwardly. Accordingly, the lower magnetic layer 100 and the upper magnetic layer 200 may have the anti-parallel magnetization directions and may exhibit a high resistance state. In the high resistance state, data corresponding to "1" may be stored.

Referring to FIGS. 2 and 6, when current flows from the bit line BL to the source line SL, the magnetization direction may tend to direct downwardly, contrary to the easy magnetization axis. Accordingly, the lower magnetic layer 100 and the upper magnetic layer 200 may have the same downward magnetization direction and thus may exhibit a low resistance state. In the low resistance state, data corresponding to "0" may be stored.

In contrast, when the magnetization direction of the upper magnetic layer 200 is fixed upwardly, data may be stored contrary to the above descriptions. For example, when current flows from the source line SL to the bit line BL, data corresponding to "0" may be stored; and when current flows from the bit line BL to the source line SL, data corresponding to "1" may be stored.

As illustrated in FIGS. 3 through 6, when the lower magnetic layer 100 and the upper magnetic layer 200 store data according to the magnetization direction, a current value flowing in the magnetic memory layer 60 may vary. By detecting a difference in the current value, the stored data may be read.

Figure 7:
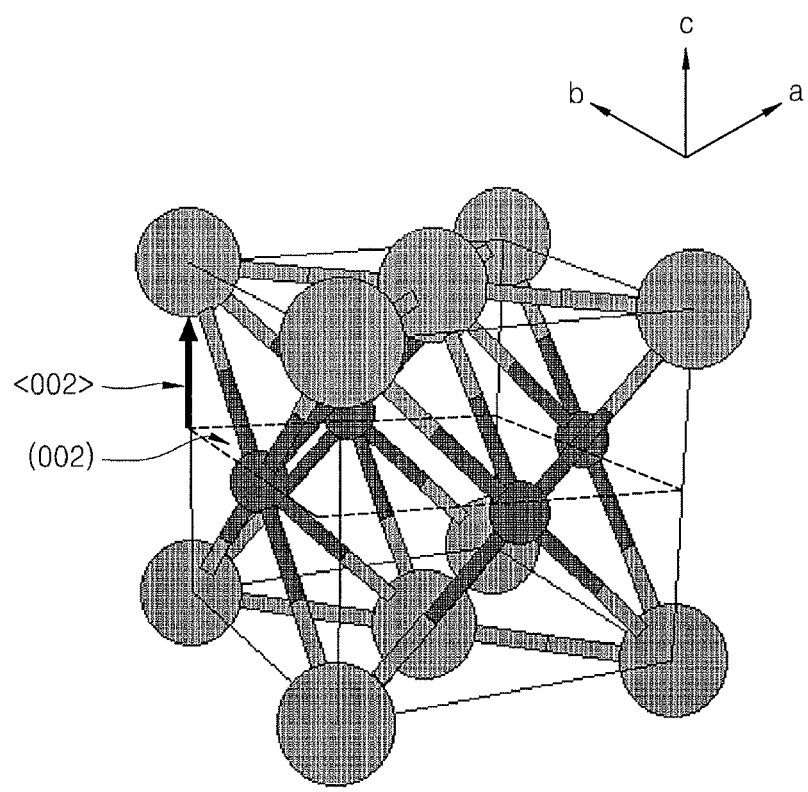
FIG. 7 illustrates a L10 crystal structure of a magnetic material for forming a magnetic memory layer according to an embodiment.

The structures of the lower magnetic layer 100 and the upper magnetic layer 200 (included in the magnetic memory layer 60) will be described below. FIG. 7 illustrates a L10 crystal structure of a magnetic material for forming the magnetic memory layer according to an embodiment.

To embody a high integrity and high density spin-transfer torque MRAM (STT-MRAM), it may be desirable for the magnetic memory layer 60 to exhibit a low critical current density and a high thermal stability. Thus, the lower magnetic layer 100 and the upper magnetic layer 200 (included in the magnetic memory layer 60) may be formed of a material having large magnetic anisotropic energy. The material having large magnetic anisotropic energy may include, e.g., amorphous-based rare-earth element alloys, (Co/Pt) or multilayered thin films such as (Co/Pt)n, and ordered lattice structure materials in an L10 crystal structure. Among the above materials, an L10 crystal structure material having very high magnetic anisotropic energy may be easy to embody a vertical magnetization type STT-MRAM.

Referring to FIG. 7, the L10 crystal structure may have a face-centered-tetragonal (FCT) structure and may have lattice constants, e.g., the lattice constants of an a-axis and a b-axis may be the same and the lattice constant of a c-axis may be less than that of the a-axis. Thus, the c-axis may be an easy magnetization axis. To magnetize the lower magnetic layer 100 and the upper magnetic layer 200 in a vertical direction, a layer may be grown such that the c-axis is perpendicular to a surface, e.g., the layer may be grown in a <002> crystal direction that is perpendicular to a (002) crystal surface.

To grow the layer having an L10 crystal structure in the <002> crystal direction, a seed layer may be formed. A metal or an alloy having a body centered cubic (BCC) crystal structure or a face centered cubic (FCC) crystal structure, an intermetallic compound having a CsCl (B1) crystal structure, an oxide or nitride of a NaCl (B2) crystal structure, fluorite, or a compound having a perovskite structure, may be used as the seed layer. When the material having a BCC crystal structure is used as a seed layer, a (110) surface of the BCC crystal structure may be a close packed plane. Thus, the seed layer may grow in the <110> direction. Accordingly, an additional seed layer to facilitate growth of a layer in the <002> crystal direction may be used. The seed layers for a magnetic layer having the L10 crystal structure will be described in detail below.

FIGS. 8 through 11 illustrate diagrams of lower magnetic layers 100, 100a, 100b, and 100c according to some embodiments.

Figure 8:
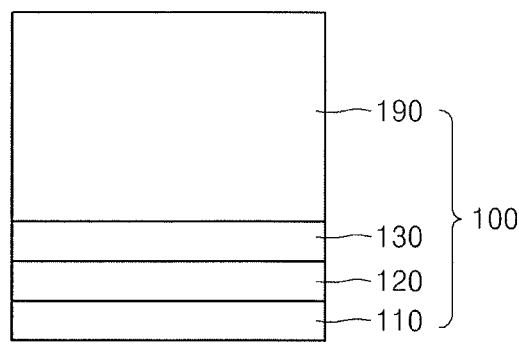
FIGS. 8 through 11 illustrate sectional views of lower magnetic layers according to some embodiments.

Referring to FIG. 8, the lower magnetic layer 100 may include a lower base layer 110, a first lower seed layer 120, a second lower seed layer 130, and a lower main magnetic layer 190, which may be sequentially stacked. The second lower seed layer 130 may be on the first lower seed layer 120 and may have a BCC crystal structure growing in the <002> crystal direction with respect to a surface of the first lower seed layer 120. The lower main magnetic layer 190 may be on the second lower seed layer 130 and may have an L10 crystal structure growing in the <002> crystal direction with respect to a surface of the second lower seed layer 130.

The lower base layer 110 may include, e.g., an oxide and/or an amorphous material having no crystal direction. In an implementation, the lower base layer 110 may include, e.g., boron (B) or silicon (Si). In another implementation, the lower base layer 110 may be omitted.

When the lower magnetic layer 100 is a pinned layer (in which the magnetization direction is fixed), the lower base layer 110 may function as a pinning layer for fixing the magnetization direction of the lower magnetic layer 100 due to ferromagnetic exchange coupling. The lower base layer 110 may further include an anti-ferromagnetic material, e.g., iron-manganese (FeMn), iridium-manganese (IrMn), or platinum-manganese (PtMn).

The first lower seed layer 120 and the second lower seed layer 130 may be sequentially disposed on the lower base layer 110. The first lower seed layer 120 and the second lower seed layer 130 may be layers for growing the lower main magnetic layer 190. For example, the first lower seed layer 120 and the second lower seed layer 130 may facilitate the growth of the lower main magnetic layer 190 in the <002> crystal direction.

The first lower seed layer 120 may change a surface energy between the lower base layer 110 and the second lower seed layer 130 to thereby improve growth of the second lower seed layer 130 in the <002> crystal direction. The first lower seed layer 120 may include at least one of titanium (Ti), tantalum (Ta), platinum (Pt), and iron (Fe). The first lower seed layer 120 may have a thickness of about 1 Å to about 15 Å. In an implementation, the first lower seed layer 120 may be formed as a monoatomic layer.

The second lower seed layer 130 may be configured to have a little or slight difference in the lattice constant from that of an L10-type ordered alloy for forming the lower main magnetic layer 190. The second lower seed layer 130 may have a BCC crystal structure and may include, e.g., chromium (Cr) or a chromium-based alloy such as a chromium alloy. The second lower seed layer 130 may be configured to grow in the <002> crystal direction. In an implementation, the second lower seed layer 130 may be formed at a temperature of about 300° C. to about 500° C.

In an implementation, the second lower seed layer 130 may further include molybdenum (Mo) or ruthenium (Ru). Such an additive element may change the lattice constant of the second lower seed layer 130. Accordingly, the second lower seed layer 130 may reduce a difference in the lattice constant from the first lower seed layer 120 or the lower main magnetic layer 190.

The lower main magnetic layer 190 may be a layer for determining the magnetization direction of the lower magnetic layer 100 and may have an L10 crystal structure growing in the <002> crystal direction. The lower main magnetic layer 190 may be an ordered alloy and may include at least one of iron (Fe), cobalt (Co), nickel (Ni), palladium (Pd), and platinum (Pt). For example, the lower main magnetic layer 190 may include at least one of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. The alloys may be, e.g., in a stoichiometric expression, $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$.

In an implementation, the lower main magnetic layer 190 may further include a non-magnetic element, e.g., boron (B), carbon (C), copper (Cu), silver (Ag), gold (Au), and/or chromium (Cr), or an oxide or nitride, e.g., boron oxide ($B_2O_3$), silicon oxide (SiO$_2$), magnesium oxide (MgO), and/or aluminum oxide (Al$_2$O$_3$), to improve a degree of L10 crystal order, decrease magnetic anisotropic energy density, and/or decrease saturation magnetization.

Figure 9:
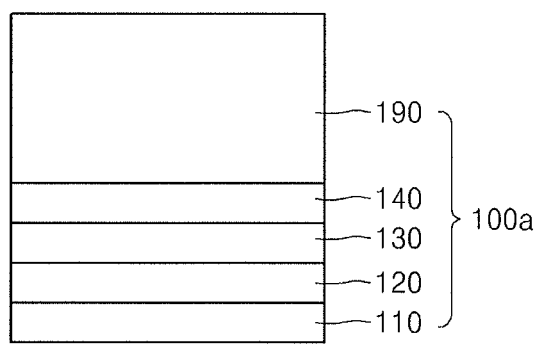

Referring to FIG. 9, a lower magnetic layer 100a may include the lower base layer 110, the first lower seed layer 120, the second lower seed layer 130, a third lower seed layer 140, and the lower main magnetic layer 190, which may be sequentially stacked. For example, the lower magnetic layer 100a may further include the third lower seed layer 140 on the second lower seed layer 130. The second lower seed layer 130 may be on the first lower seed layer 120 and may have a BCC crystal structure growing in the <002> crystal direction with respect to the surface of the first lower seed layer 120. The third lower seed layer 140 may be on the second lower seed layer 130 and may have a FCC crystal structure growing in the <002> crystal direction with respect to the surface of the second lower seed layer 130. The lower main magnetic layer 190 may be on the third lower seed layer 140 and may have an L10 crystal structure growing in the <002> crystal direction with respect to a surface of the third lower seed layer 140. In FIG. 9, repeated descriptions on the elements that are substantially the same as or correspond to those described with reference to FIG. 8 are omitted.

The third lower seed layer 140 may be configured to have a little or slight difference in the lattice constant from that of the L10-type ordered alloy forming the lower main magnetic layer 190. The third lower seed layer 140 may have a FCC crystal structure and may include, e.g., palladium (Pd), platinum (Pt), or both, or an alloy of Pd and Pt. The third lower seed layer 140 may be configured to grow in the <002> crystal direction. In an implementation, the third lower seed layer 140 may be formed at a temperature of about 300° C. to about 500° C. The third lower seed layer 140 may alleviate stress generated due to a difference in the lattice constant between the second lower seed layer 130 and the lower main magnetic layer 190.

Figure 10:
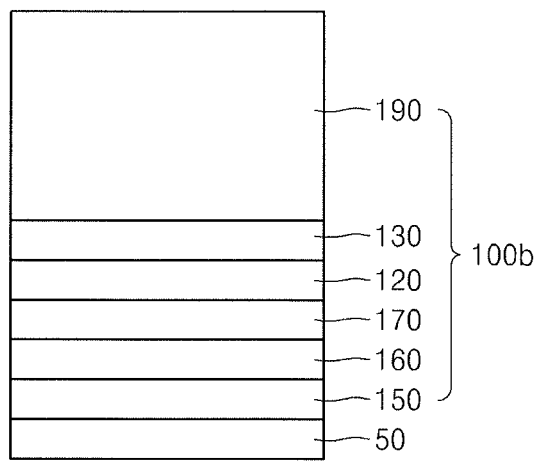
Figure 11:
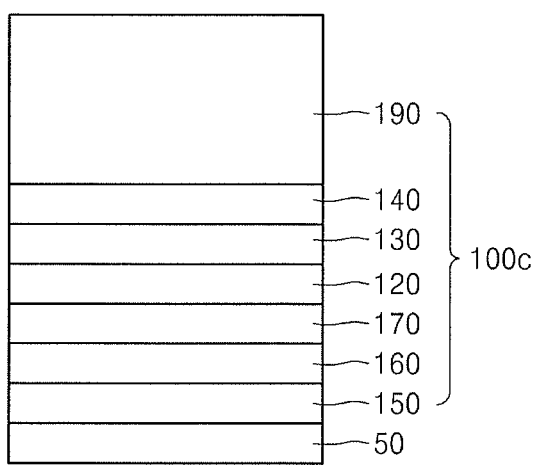

FIGS. 10 and 11 illustrate embodiments in which a lower magnetic layer 100b, 100c is formed on a conductive layer, e.g., the lower electrode 50, instead of the lower base layer 110.

Referring to FIG. 10, the lower magnetic layer 100b may include a crystalline stop layer 150, an amorphous layer 160, an NaCl structure layer 170, the first lower seed layer 120, the second lower seed layer 130, and the lower main magnetic layer 190. In FIG. 10, repeated descriptions on the elements that are substantially the same as or correspond to those described with reference to FIGS. 8 and 9 are omitted.

The crystalline stop layer 150 may block continuity of a crystal structure so that the crystal direction of the lower electrode 50 does not affect the crystal growth direction of the lower main magnetic layer 190. The crystalline stop layer 150 may include at least one of tantalum (Ta), ruthenium (Ru), and titanium (Ti).

The amorphous layer 160 may include an oxide and an amorphous material that does not have a crystal direction. Also, the amorphous layer 160 may include boron (B) or silicon (Si). The amorphous layer 150 may facilitate growth of the NaCl structure layer 170 in the <002> crystal direction. In an implementation, the amorphous layer 160 may be omitted.

When the lower magnetic layer 100b is a pinned layer (in which the magnetization direction is fixed), the amorphous layer 160 may function as a pinning layer that fixes the crystal direction of the lower magnetic layer 100 due to ferromagnetic exchange coupling. In an implementation, the amorphous layer 160 may further include an anti-ferromagnetic material, e.g., iron-manganese (FeMn), iridium-manganese (IrMn), or platinum-manganese (PtMn).

The NaCl structure layer 170 may include a material that easily grows in the <002> crystal direction, compared to the first and second lower seed layers 120 and 130. The NaCl structure layer 170 may include an oxide or a nitride, e.g., MgO.

The crystalline stop layer 150, the amorphous layer 160, and the NaCl structure layer 170 may have thicknesses of about 1 Å to about 5 Å. The crystalline stop layer 150 and the amorphous layer 160 may further increase the growth of the first lower seed layer 120 or the second lower seed layer 130 in the <002> crystal direction as the thicknesses of the crystalline stop layer 150 and the amorphous layer 160 decrease. In contrast, as the thickness of the NaCl structure layer 170 increases, the growth of the first lower seed layer 120 or the second lower seed layer 130 in the <002> crystal direction increases. However, when the thickness of the NaCl structure layer 170 increases, specific resistance of the lower electrode 50 may increase.

Referring to FIG. 11, the lower magnetic layer 100c may include the crystalline stop layer 150, the amorphous layer 160, the NaCl structure layer 170, the first lower seed layer 120, the second lower seed layer 130, the third lower seed layer 140, and the lower main magnetic layer 190. In FIG. 11, repeated descriptions on the elements that are substantially the same as or correspond to those described with reference to FIGS. 8 through 9 are omitted.

The third lower seed layer 140 may be on the second lower seed layer 130 and may have a FCC crystal structure growing in the <002> crystal direction with respect to the surface of the second lower seed layer 130. The lower main magnetic layer 190 may be on the third lower seed layer 140 and may have an L10 crystal structure growing in or according to the <002> crystal direction with respect to a surface of the third lower seed layer 140.

Figure 12:
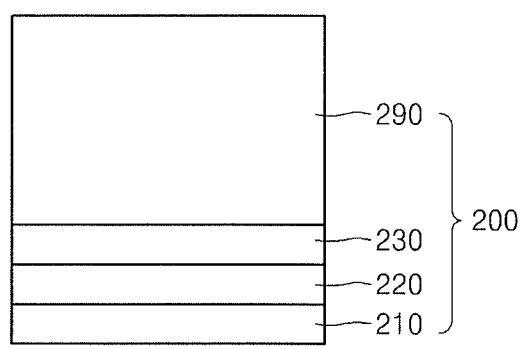
FIGS. 12 and 13 illustrate sectional views of upper magnetic layers according to some embodiments.
Figure 13:
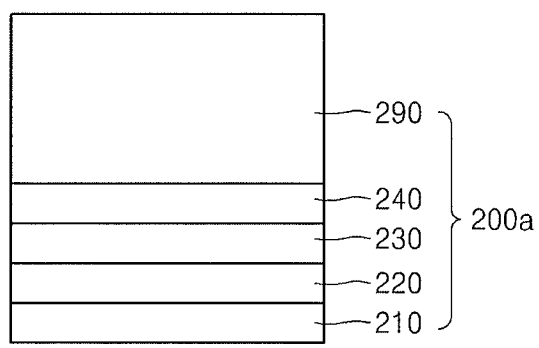

FIGS. 12 and 13 illustrate sectional views of upper magnetic layers 200 and 200a according to some embodiments.

Referring to FIG. 12, the upper magnetic layer 200 may include an upper base layer 210, a first upper seed layer 220, a second upper seed layer 230, and an upper main magnetic layer 290, which may be sequentially stacked. The second upper seed layer 230 may be on the first lower seed layer 220 and may have a BCC crystal structure growing in the <002> crystal direction with respect to a surface of the first lower seed layer 220. The upper main magnetic layer 290 may be on the second upper seed layer 230 and may have an L10 crystal structure growing in the <002> crystal direction with respect to a surface of the second upper seed layer 230.

The upper base layer 210 may include an oxide and an amorphous material having no crystal direction. Also, the upper base layer 210 may include boron (B) or silicon (Si). In an implementation, the upper base layer 210 may be omitted. Also, the upper base layer 210 may be the tunnel barrier layer 300 of FIG. 2.

When the upper magnetic layer 200 is a pinned layer (in which the magnetization direction is fixed), the upper base layer 210 may function as a pinning layer for fixing the magnetization direction of the upper magnetic layer 200 due to ferromagnetic exchange coupling. The upper base layer 210 may further include an anti-ferromagnetic material, e.g., iron-manganese (FeMn), iridium-manganese (IrMn), or platinum-manganese (PtMn).

The first upper seed layer 220 and the second upper seed layer 230 may be sequentially stacked on the upper base layer 210. The first upper seed layer 220 and the second upper seed layer 230 may be seed layers for growing the upper main magnetic layer 290. For example, the first upper seed layer 220 and the second upper seed layer 230 may facilitate the growth of the upper main magnetic layer 290 in the <002> crystal direction.

The first upper seed layer 220 may change a surface energy between the upper base layer 210 and the second upper seed layer 230 to thereby improve the growth of the second upper seed layer 230 in the <002> crystal direction. The first upper seed layer 220 may include at least one of titanium (Ti), tantalum (Ta), platinum (Pt), and iron (Fe). The first upper seed layer 220 may have a thickness of about 1 Å to about 15 Å and may be formed as a monoatomic layer.

The second upper seed layer 230 may be configured to have a little or slight difference in the lattice constant from that of an L10-type ordered alloy forming the upper main magnetic layer 290. The second upper seed layer 230 may have a BCC crystal structure and may include, e.g., chromium (Cr) or a chromium-based alloy such as a chromium alloy. The second upper seed layer 230 may be configured to grow in the <002> crystal direction. In an implementation, the second upper seed layer 230 may be formed at a temperature of about 300° C. to about 500° C.

The second upper seed layer 230 may further include molybdenum (Mo) or ruthenium (Ru). Such an additive element may change the lattice constant of the second upper seed layer 230. Accordingly, the second upper seed layer 230 may reduce a difference in the lattice constant from the first upper seed layer 220 or the upper main magnetic layer 290.

The upper main magnetic layer 290 may be a layer for determining the magnetization direction of the upper magnetic layer 200 and may have an L10 crystal structure growing in the <002> crystal direction. The upper main magnetic layer 290 may be an ordered alloy and may include at least one of iron (Fe), cobalt (Co), nickel (Ni), palladium (Pd), and platinum (Pt). For example, the upper main magnetic layer 290 may include at least one of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. The alloys may be, e.g., in a stoichiometric expression, $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$.

In an implementation, the upper main magnetic layer 290 may further include a non-magnetic element, e.g., boron (B), carbon (C), copper (Cu), silver (Ag), gold (Au), or chromium (Cr), or an oxide or a nitride, e.g., boron oxide ($B_2O_3$), silicon oxide ($SiO_2$), magnesium oxide (MgO), or aluminum oxide ($Al_2O_3$), to improve a degree of L10 crystal order, decrease magnetic anisotropic energy density, and/or decrease saturation magnetization.

Referring to FIG. 13, the upper magnetic layer 200a may include the upper base layer 210, the first upper seed layer 220, the second upper seed layer 230, a third upper seed layer 240, and the upper main magnetic layer 290, which may be sequentially stacked. For example, the upper magnetic layer 200a may further include the third upper seed layer 240 on the second upper seed layer 230. The second upper seed layer 230 may be on the first upper seed layer 220 and may have a BCC crystal structure growing in the <002> crystal direction with respect to the surface of the first upper seed layer 220. The third upper seed layer 240 may be on the second upper seed layer 230 and may have a FCC crystal structure growing in the <002> crystal direction with respect to the surface of the second upper seed layer 230. The upper main magnetic layer 290 may be on the third upper seed layer 240 and may have an L10 crystal structure growing in the <002> crystal direction with respect to a surface of the third upper seed layer 240. In FIG. 13, repeated descriptions on the elements that are substantially the same as or correspond to those described with reference to FIG. 12 are omitted.

The third upper seed layer 240 may be configured to have a little or slight difference in the lattice constant from that of the L10-type ordered alloy forming the upper main magnetic layer 290. The third upper seed layer 240 may have a FCC crystal structure and may include, e.g., palladium (Pd), platinum (Pt), or both, or an alloy of Pd and Pt. The third upper seed layer 240 may be configured to grow in the <002> crystal direction. In an implementation, the third upper seed layer 240 may be formed at a temperature of about 300° C. to about 500° C. The third upper seed layer 240 may alleviate stress generated due to a difference in the lattice constant between the second upper seed layer 230 and the upper main magnetic layer 290.

Figure 14:
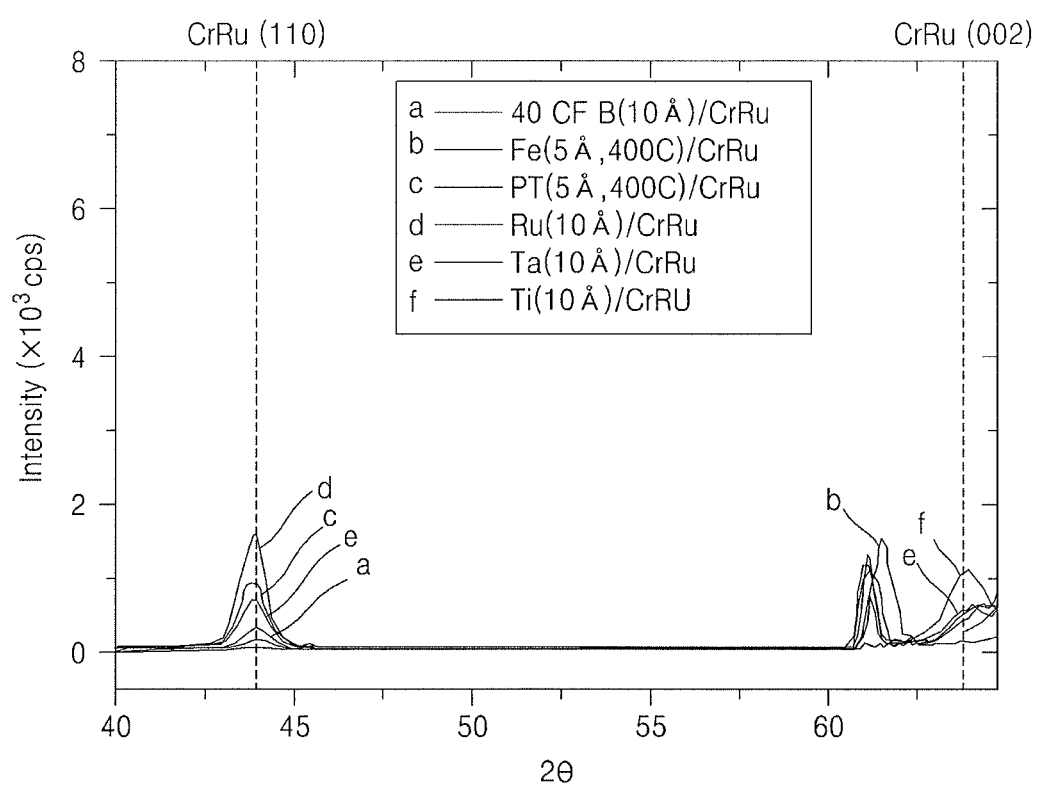
FIGS. 14 and 15 illustrate graphs showing X-ray diffusion characteristics of seed layers of a magnetic memory device according to example embodiments.
Figure 15:
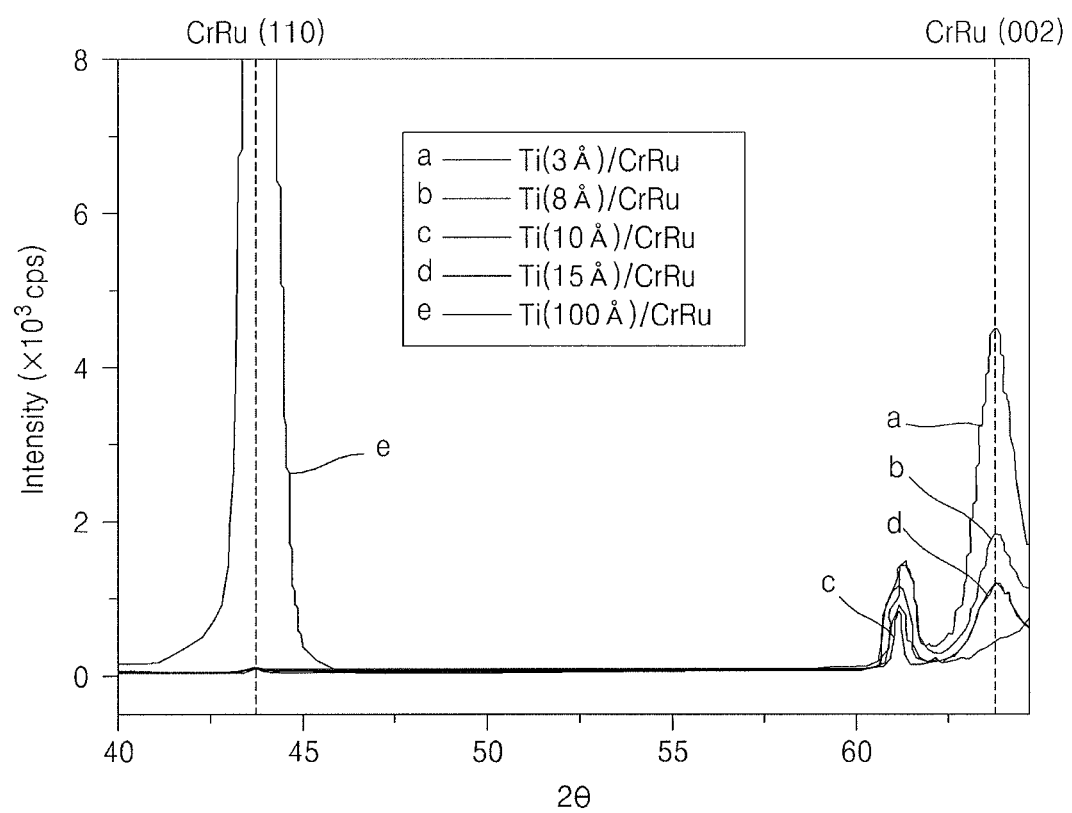

FIGS. 14 and 15 illustrate graphs showing X-ray diffusion characteristics of the seed layers according to some embodiments.

Referring to FIG. 14, chromium-ruthenium (CrRu) was grown on each of seed layers respectively including iron (Fe), platinum (Pt), ruthenium (Ru), tantalum (Ta), and titanium (Ti), and crystal growth directions of CrRu on the respective seed layers were measured. CrRu was grown according to the <110> crystal direction and the <002> crystal direction. It may be seen that growth of CrRu according to the <002> crystal direction appeared to be superior on the Ti and Ta seed layers, especially, the most superior on the Ti seed layer.

Referring to FIG. 15, CrRu was grown on each of Ti seed layers having different thicknesses; and crystal growth directions of CrRu on the respective Ti seed layers was measured. As the thickness of a Ti seed layer decreased, more CrRu grew according to the <002> crystal direction. For example, when the Ti seed layer had a thickness of about 1 Å to about 15 Å, the growth of CrRu according to the <002> crystal direction appeared to be dominant. In contrast, when the Ti seed layer had a thickness of 100 Å, CrRu hardly grew according to the <002> crystal direction. For example, when the thickness of a Ti seed layer decreased, the Ti seed layer did not form its own crystal structure, e.g., a hexagonal crystal system. However, when the thickness of the Ti seed layer increased, the Ti seed layer was formed to have its own crystal structure so that the growth of CrRu according to the <002> crystal direction was hindered.

For example, when the thickness of the first lower seed layer 120 or the first upper seed layer 220 of FIGS. 8 through 13 decreases, the growth of the second lower seed layer 130 or the second upper seed layer 230 according to the <002> crystal direction may be facilitated. In contrast, when the thickness of the first lower seed layer 120 or the first upper seed layer 220 of FIGS. 8 through 13 increases, the growth of the second lower seed layer 130 or the second upper seed layer 230 according to the <002> crystal direction may be deteriorated.

Figure 16:
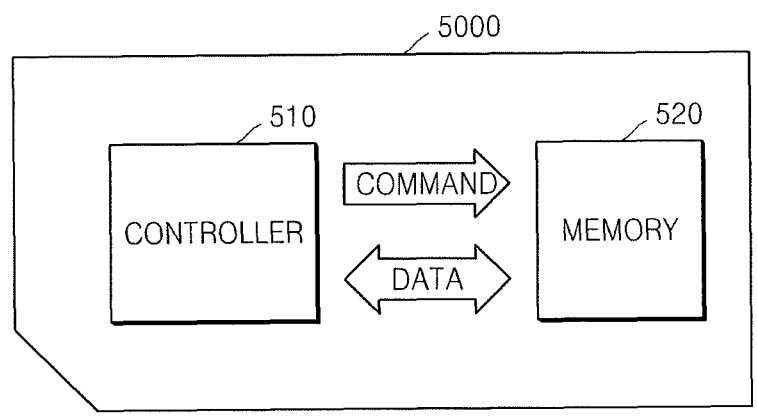
FIG. 16 illustrates a block diagram of a memory card according to an embodiment.

FIG. 16 illustrates a block diagram showing a memory card 5000 according to an embodiment.

Referring to FIG. 16, a controller 510 and a memory 520 may be arranged in the memory card 5000 to exchange electric signals. For example, when the controller 510 issues a command, the memory 520 may transmit data. The memory 520 may include a magnetic memory device according to any one of the above-descried embodiments. A magnetic memory device according to the embodiments may be arranged in an architecture memory array (not shown) having a variety of shapes corresponding to a corresponding logic gate design that is well know to a technical field to which the present inventive concept pertains to. A memory array in which a plurality of rows and columns are arranged may form one or more memory array bank (not shown). The memory 520 may include a memory array (not shown) or a memory array bank (not shown). Also, the memory card 5000 may further include a typical row decoder (not shown), a column decoder (not shown), I/O buffers (not shown), and/or a control register (not shown) to drive the above-described memory array bank (not shown). The memory card 5000 may be used for a variety of memory cards, e.g., memory stick cards, smart media (SM) cards, secure digital (SD) cards, or multimedia cards (MMC).

Figure 17:
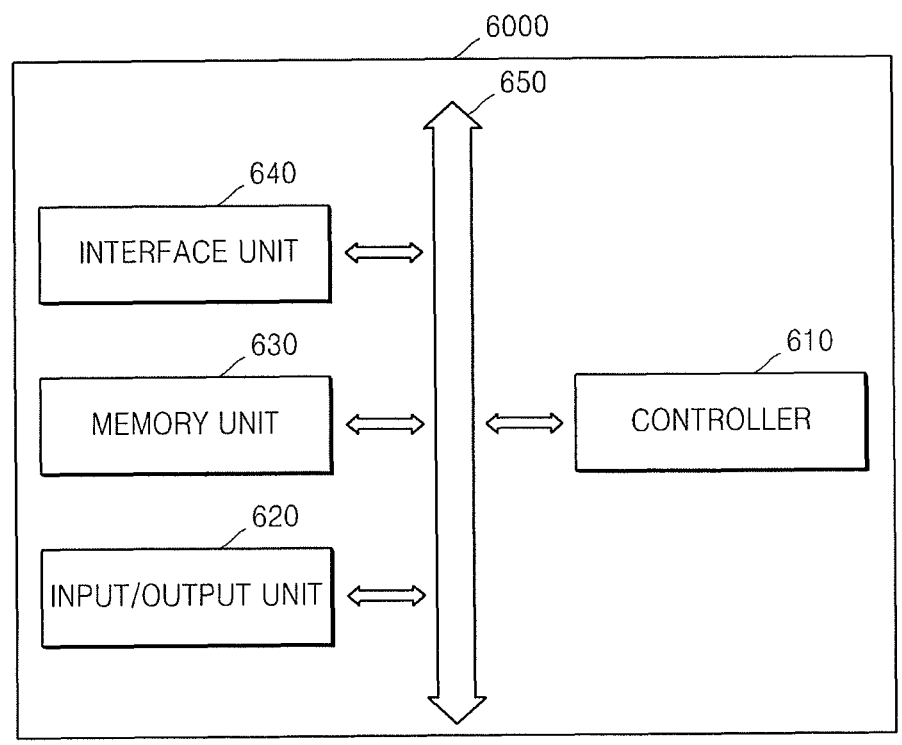
FIG. 17 illustrates a block diagram of a system according to an embodiment.

FIG. 17 illustrates a block diagram showing a system according to an embodiment of the present inventive concept.

Referring to FIG. 17, the system 6000 may include a controller 610, an input/output (I/O) unit 620, a memory unit 630, and an interface unit 640. The system 6000 may be a mobile system or a system for transmitting or receiving information. The mobile system may be, e.g., a PDA, a portable computer, a web tablet, a wireless phone, a mobile phone, a smart phone, a digital music player, or a memory card. The controller 610 may execute a program and control the system 6000. The controller 610 may be, e.g., a microprocessor, a digital signal processor, a microcontroller, or a device similar thereto. The I/O unit 620 may be used to input or output data of the system 6000. The system 6000 may exchange data with an external apparatus such as a personal computer or a network by being connected to the external apparatus using the I/O unit 620. The I/O unit 620 may be, e.g., a keypad, a keyboard, or a display. The memory 630 may store codes and/or data for the operation of the controller 610 and/or store data processed by the controller 610. The memory 630 may include a magnetic memory device according to any one of the above-described exemplary embodiments. The interface unit 640 may be a data transmission path between the system 6000 and an external apparatus. The controller 610, the I/O unit 620, the memory unit 630, and the interface unit 640 may communicate with one another through a bus 650. For example, the system 6000 may be used for mobile phones, MP3 players, navigations, portable multimedia players (PMPs), solid state disks (SSDs), or household appliances.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A magnetic memory layer, comprising:
a base layer;
a first seed layer on the base layer;
a second seed layer above and directly on the first seed layer, the second seed layer having a body centered cubic (BCC) crystal structure grown according to a <002> crystal direction with respect to a surface of the first seed layer thereunder; and
a main magnetic layer on the second seed layer, wherein the main magnetic layer is grown according to the <002> crystal direction with respect to a surface of the second seed layer thereunder and wherein the first seed layer has a property to change a surface energy between the base layer and second seed layer to increase growth of the second seed layer in the <002> crystal direction.

2. The magnetic memory layer as claimed in claim 1, wherein the <002> crystal direction of the main magnetic layer is an easy magnetization direction.

3. The magnetic memory layer as claimed in claim 1, wherein the first seed layer includes at least one of titanium, tantalum, platinum, and iron.

4. The magnetic memory layer as claimed in claim 1, wherein the first seed layer has a thickness of about 1 Å to about 15 Å.

5. The magnetic memory layer as claimed in claim 1, wherein the first seed layer is a monoatomic layer.

6. The magnetic memory layer as claimed in claim 1, wherein the first seed layer and the second seed layer have body centered cubic crystal structures, the first and second seed layers being grown according to different crystal directions.

7. The magnetic memory layer as claimed in claim 6, wherein:
the first seed layer is grown according to a <110> crystal direction, and
the main magnetic layer has an L10 crystal structure based on both the <002> crystal direction of the second seed layer and the <110> crystal direction on the first seed layer.

8. The magnetic memory layer as claimed in claim 1, further comprising
a third seed layer between the second seed layer and the main magnetic layer,
the third seed layer grown according to the <002> crystal direction with respect to the surface of the second seed layer and having a different crystal structure from that of the second seed layer.

9. The magnetic memory layer as claimed in claim 8, wherein the third seed layer has a face centered cubic crystal structure.

10. The magnetic memory layer as claimed in claim 8, wherein the third seed layer includes palladium, platinum, or both palladium and platinum.

11. The magnetic memory layer as claimed in claim 1, further comprising a base layer under the first seed layer, the base layer including an amorphous material having no crystal direction.

12. The magnetic memory layer as claimed in claim 1, wherein the main magnetic layer includes at least one of iron, cobalt, nickel, palladium, and platinum.

13. The magnetic memory layer as claimed in claim 1, wherein the main magnetic layer includes at least one of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy.

14. The magnetic memory layer as claimed in claim 1, wherein the main magnetic layer includes at least one of boron, carbon, copper, silver, gold, and chromium.

15. The magnetic memory layer as claimed in claim 1, wherein the main magnetic layer includes at least one of boron oxide ($B_2O_3$), silicon oxide ($SiO_2$), magnesium oxide (MgO), or aluminum oxide ($Al_2O_3$).

16. The magnetic memory layer as claimed in claim 1, wherein the second seed layer includes chromium (Cr) or a chromium alloy.

17. The magnetic memory layer as claimed in claim 16, wherein the second seed layer further includes molybdenum or ruthenium.

18. A magnetic memory device, comprising:
a conductive layer having a crystal structure;

a crystalline stop layer on the conductive layer, the crystalline stop layer blocking continuity of the crystal structure;
an amorphous layer on the crystalline stop layer;
a NaCl structure layer on the amorphous layer;
a first seed layer on the NaCl structure layer;
a second seed layer above and directly on the first seed layer, the second seed layer grown according to a <002> crystal direction with respect to a surface of the first seed layer thereunder; and
a main magnetic layer disposed on the second seed layer, the main magnetic layer grown according to the <002> crystal direction with respect to a surface of the second seed layer thereunder.

19. A magnetic memory device, comprising:
a lower electrode;
a magnetic memory layer on and electrically connected with the lower electrode, the magnetic memory layer including a lower magnetic layer, an upper magnetic layer, and a tunnel barrier layer; and
an upper electrode on and electrically connected with the magnetic memory layer,
wherein the lower magnetic layer includes:
a base layer;
a first lower seed layer on the base layer;
a second lower seed layer above and directly on the first lower seed layer, the second lower seed layer having a body centered cubic (BCC) crystal structure grown according to a <002> crystal direction with respect to a surface of the first lower seed layer thereunder; and
a lower main magnetic layer on the second lower seed layer, wherein the lower main magnetic layer is grown according to the <002> crystal direction with respect to a surface of the second lower seed layer thereunder and wherein the first lower seed layer has a property to change a surface energy between the base layer and second lower seed layer to increase growth of the second lower seed layer in the <002> crystal direction.

20. The magnetic memory device as claimed in claim 19, wherein the upper magnetic layer includes:
a first upper seed layer;
a second upper seed layer on the first upper seed layer, the second upper seed layer grown according to the <002> crystal direction with respect to a surface of the first upper seed layer; and
an upper main magnetic layer on the second upper seed layer, the upper main magnetic layer grown according to the <002> crystal direction with respect to a surface of the second upper seed layer.

* * * * *